United States Patent
Nagata et al.

(10) Patent No.: US 9,704,695 B2
(45) Date of Patent: Jul. 11, 2017

(54) SPUTTERING TARGET AND MANUFACTURING METHOD THEREFOR

(75) Inventors: Kenichi Nagata, Ibaraki (JP); Tomio Otsuki, Ibaraki (JP); Takeo Okabe, Ibaraki (JP); Nobuhito Makino, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/348,174

(22) PCT Filed: Sep. 12, 2012

(86) PCT No.: PCT/JP2012/073273
§ 371 (c)(1),
(2), (4) Date: Jul. 15, 2014

(87) PCT Pub. No.: WO2013/047199
PCT Pub. Date: Apr. 4, 2013

(65) Prior Publication Data
US 2014/0318953 A1    Oct. 30, 2014

(30) Foreign Application Priority Data

Sep. 30, 2011  (JP) ................. 2011-216326

(51) Int. Cl.
C23C 14/35  (2006.01)
H01J 37/34  (2006.01)
C22C 9/05   (2006.01)
C23C 14/34  (2006.01)
B21D 53/00  (2006.01)

(52) U.S. Cl.
CPC .......... H01J 37/3435 (2013.01); B21D 53/00 (2013.01); C22C 9/05 (2013.01); C23C 14/3407 (2013.01); C23C 14/3414 (2013.01); H01J 37/3414 (2013.01); H01J 37/3426 (2013.01)

(58) Field of Classification Search
CPC ............................... H01J 37/3426; C22C 9/05
See application file for complete search history.

(56) References Cited

U.S. PATENT DOCUMENTS

| | | | |
|---|---|---|---|
| 3,725,052 A * | 4/1973 | Hakaru | 420/434 |
| 6,723,187 B2 | 4/2004 | Segal et al. | |
| 6,875,325 B2 | 4/2005 | Miyashita et al. | |
| 7,229,510 B2 | 6/2007 | Nakamura | |
| 7,347,353 B2 | 3/2008 | Yamakoshi et al. | |
| 7,507,304 B2 | 3/2009 | Okabe et al. | |
| 7,713,364 B2 | 5/2010 | Nakamura | |
| 7,740,721 B2 | 6/2010 | Okabe | |
| 8,246,764 B2 | 8/2012 | Okabe et al. | |
| 8,482,189 B2 | 7/2013 | Goto et al. | |
| 9,090,970 B2 | 7/2015 | Nagata et al. | |
| 9,165,750 B2 | 10/2015 | Nagata et al. | |
| 2004/0016635 A1 * | 1/2004 | Ford et al. | 204/192.1 |
| 2004/0072009 A1 | 4/2004 | Segal et al. | |
| 2007/0002239 A1 | 1/2007 | Koike | |
| 2007/0051624 A1 | 3/2007 | Okabe et al. | |
| 2008/0116066 A1 | 5/2008 | Miyashita | |
| 2009/0045051 A1 | 2/2009 | Ferrasse et al. | |
| 2009/0101495 A1 * | 4/2009 | Aoki et al. | 204/298.13 |
| 2009/0229975 A1 | 9/2009 | Yamakoshi | |
| 2010/0013096 A1 | 1/2010 | Irumata et al. | |
| 2011/0056828 A1 | 3/2011 | Miao et al. | |
| 2011/0281134 A1 | 11/2011 | Maki et al. | |
| 2012/0325655 A1 | 12/2012 | Iwasaki et al. | |
| 2014/0158532 A1 | 6/2014 | Nagata et al. | |
| 2014/0284211 A1 | 9/2014 | Nagata et al. | |
| 2014/0367253 A1 | 12/2014 | Okabe et al. | |
| 2015/0279638 A1 | 10/2015 | Otsuki et al. | |

FOREIGN PATENT DOCUMENTS

| | | |
|---|---|---|
| JP | 9-209133 A | 8/1997 |
| JP | 10-110226 A | 4/1998 |
| JP | H11-236665 A | 8/1999 |
| JP | 11-335826 A | 12/1999 |
| JP | 2001-064771 A | 3/2001 |
| JP | 2002-121662 A | 4/2002 |
| JP | 2006-073863 A | 3/2006 |
| JP | 2006-161101 A | 6/2006 |
| WO | 2011/105583 A1 | 9/2011 |

* cited by examiner

*Primary Examiner* — Jason M Berman
(74) *Attorney, Agent, or Firm* — Howson & Howson, LLP

(57) ABSTRACT

A backing plate integrated sputtering target includes a flange part having a Vicker's hardness (Hv) of 90 or more and a 0.2% yield stress of $6.98 \times 10^7$ N/m² or more. Enhancing the mechanical strength of only the flange part of the target inhibits the target from being deformed during sputtering, and further, does not vary the original sputtering characteristics. Consequently, the target can form a thin film having excellent uniformity. This can improve the yield and the reliability of semiconductor products, which have been progressing in miniaturization and integration.

4 Claims, No Drawings

SPUTTERING TARGET AND MANUFACTURING METHOD THEREFOR

BACKGROUND

The present invention relates to a sputtering target for forming a thin film of a semiconductor device. Specifically, the invention relates to a copper-manganese-alloy sputtering target having a self-diffusion suppression function for forming semiconductor copper alloy line.

Conventionally, Al alloys, of which specific resistance is roughly 3.0 $\mu\Omega \cdot cm$, were used as a line material of semiconductor elements. However, a copper line having lower resistance, of which specific resistance is roughly 2.0 $\mu\Omega \cdot cm$ has been put into practical use with miniaturization of lines. A Copper line is generally formed by forming a diffusion barrier layer of such as Ta or TaN in lines or line via holes and then forming a film of copper by sputtering. Copper having a high purity of 5N to 6N is usually produced from electrolytic copper having a purity of about 4N (excluding gas components) as a crude metal by a wet or dry purification process, and the purified copper is used as a sputtering target.

Though copper is very effective as a semiconductor line as described above, copper itself is a very active metal and easily diffuses, and therefore causes a problem of contaminating a Si substrate or its periphery through the semiconductor Si substrate or the insulating film thereon. In particular, with progress in miniaturization of lines, the problem cannot be sufficiently prevented by only the conventional diffusion barrier layer of Ta or TaN, and copper line materials themselves also need to be improved. Accordingly, as a copper line material, a copper alloy having a self-diffusion suppression function has been proposed, which is prepared by adding manganese (Mn) to copper (Cu), by forming a barrier layer by itself through a reaction of Mn in the Cu—Mn alloy with oxygen in an insulating film (e.g., Patent Literature 1).

The sputtering target mentioned above is usually bonded to a backing plate with a bonding material and the like. After the use of the target, it is necessary to stop the sputtering apparatus and replace the used target with a new one. In order to reduce the manufacturing cost by shortening this stop time (down time) as much as possible, an increase in the thickness of the target itself has been demanded by unifying the target and the backing plate. In such an integrated target, however, the mechanical strength is insufficient to prevent deformation such as a warpage of the target during sputtering.

In order to overcome such a disadvantage, for example, Patent Literature 2 discloses a technology; that is, even in sputtering at high output, it is possible to prevent the deformation such as a warpage of an integrated structuretype target composed of a target and a backing plate made with the same material by increasing the mechanical strength through plastic working of the target. This technology, however, has a problem that a change in conditions of plastic working for increasing the mechanical strength of the entire target varies the sputtering characteristics of the target itself, resulting in not being able to achieve desired product performance.

Patent Literature 3 describes a technology of preventing occurrence of coarse particles by forming a cavity by irradiating a non-erosion portion of a sputtering target with laser light to reduce the hardness of the cavity bottom compared to that of the surface of the non-erosion portion. This technology softens the melting portion through laser irradiation to reduce the hardness of the cavity bottom compared to the surface of the non-erosion portion and is not a technology of increasing the strength of a target for inhibiting the target from being deformed during sputtering.

CITATION LIST

Patent Literature

Patent Literature 1: Japanese Patent Laid-Open No. 2006-73863
Patent Literature 2: Japanese Patent Laid-Open No. 2002-121662
Patent Literature 3: Japanese Patent Laid-Open No. H09-209133

SUMMARY OF INVENTION

It is an object of the present invention to improve the yield and the reliability of semiconductor products, which have been progressing in miniaturization and integration, by enhancing the mechanical strength of only the flange part of a backing plate integrated sputtering target. The enhancement is able to inhibit deformation of the target during sputtering, and further, does not vary the original sputtering characteristics, and thereby allows formation of a thin film having excellent uniformity.

In particular, it is an object of the present invention to provide a copper-manganese-alloy sputtering target having a self-diffusion suppression function useful for forming semiconductor copper alloy line that can effectively prevent the periphery of the line from being contaminated by diffusion of active Cu and has excellent, for example, electron migration (EM) resistance and corrosion resistance.

In order to solve the above-mentioned problems, the present invention provides the following aspects:

1) A backing plate integrated sputtering target comprising a flange part having a Vicker's hardness (Hv) of 90 or more and a 0.2% yield stress of $6.98 \times 10^7$ N/m² or more;
2) The backing plate integrated sputtering target according to 1) above, wherein the sputtering target and the backing plate are made of a Cu—Mn alloy;
3) The backing plate integrated sputtering target according to 2) above, having a (111) orientation ratio of 50% or less at a sputtering surface;
4) A method of producing a backing plate integrated sputtering target, the method comprising performing plastic working of a target material and then further performing plastic working of only a flange part; and
5) The method of producing a backing plate integrated sputtering target according to 4) above, wherein the sputtering target and the backing plate are made of a Cu—Mn alloy.

In the backing plate integrated sputtering target of the present invention, the mechanical strength is enhanced at only the flange part of the target. As a result, deformation of the target during sputtering is inhibited, and none the less, the original sputtering characteristics are not changed. Consequently, the target can form a thin film having excellent uniformity and therefore has an excellent effect of improving the yield and the reliability of semiconductor products, which have been progressing in miniaturization and integration.

In particular, a high-purity copper-manganese-alloy sputtering target useful for forming copper alloy line for semiconductor of the present invention, has a self-diffusion suppression function and effectively prevents the periphery of the line from being contaminated by diffusion of active Cu and shows an excellent effect in, for example, electron migration (EM) resistance and corrosion resistance.

DETAILED DESCRIPTION

In the present invention, the term "backing plate integrated sputtering target" means that the sputtering target and the backing plate are unified and are produced with the same material. In conventional targets each composed of two pieces of a sputtering target and a backing plate, the backing plate can keep the mechanical strength. Therefore, even if the mechanical strength of a target is insufficient as in the present invention, a problem of deformation (such as a warpage) during sputtering is not inherent in the target. The problem of deformation becomes apparent when a sputtering target and a backing plate are unified and when the target has a sufficiently large thickness as in the present invention.

In the present invention, the backing plate integrated sputtering target includes a flange part having a Vicker's hardness (Hv) of 90 or more and a 0.2% yield stress of $6.98 \times 10^7$ N/m² or more.

If the flange part has a Vicker's hardness (Hv) of lower than 90 or a 0.2% yield stress of lower than $6.98 \times 10^7$ N/m², the mechanical strength of the entire target is insufficient to cause a warpage in the target during sputtering, disadvantageously resulting in a reduction in uniformity of film thickness.

In the present invention, the flange part is a joint part for mounting the backing plate integrated target on a sputtering apparatus, and the flange part itself is not used in sputtering.

In the present invention, the backing plate integrated sputtering target is desirably made of a Cu—Mn alloy. The Cu—Mn alloy is useful for forming copper alloy line for semiconductor and has a self-diffusion suppression function and effectively prevents the periphery of the line from being contaminated by diffusion of active Cu and shows an excellent effect in, for example, electron migration (EM) resistance and corrosion resistance.

In the Cu—Mn alloy, the content of Mn is preferably 0.05 wt % or more and 20 wt % or less. A Mn content less than 0.05 wt % reduces the self-diffusion suppression function, whereas a Mn content exceeding 20 wt % increases the resistance and thereby disadvantageously reduces the function as copper alloy line for semiconductor. The content of Mn is more preferably 0.5 wt % or more and 10 wt % or less.

In the present invention, the backing plate integrated sputtering target made of a Cu—Mn alloy preferably has a (111) orientation ratio of 50% or less at the sputtering surface. If the sputtering surface has a (111) orientation ratio exceeding 50%, original sputtering characteristics cannot be obtained to disadvantageously require readjustment of sputtering conditions.

In the present invention, in a method of producing the backing plate integrated sputtering target, for example, a molten metal or alloy is cast to produce an ingot, and this ingot is forged at a predetermined forging ratio and then is rolled at a predetermined rolling reduction to give a rolled sheet.

Furthermore, the periphery, i.e., the flange part of this rolled sheet is further forged via hammer, die-forging or the like in order to enhance the mechanical strength. In production of the target of the present invention, forging of the periphery of the rolled sheet is important. The mechanical strength of the periphery can be appropriately controlled by changing the forging method or conditions. However, the forging process is not necessarily limited, as long as a Vicker's hardness (Hv) of 90 or more and a 0.2% yield stress of $6.98 \times 10^7$ N/m² or more can be eventually obtained.

Subsequently, the rolled sheet is heat-treated at a predetermined temperature for a predetermined time, followed by finishing processing. Thus, a backing plate integrated sputtering target is produced.

EXAMPLES

The present invention will now be described based on examples. The following examples are intended to facilitate understanding and do not limit the present invention. That is, modifications and other examples based on the technical idea of the present invention are included in the present invention.

Example 1

In Example 1, a molten and cast Cu—Mn alloy (Mn: 1 wt %) ingot was forged and rolled into a rolled sheet and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 98 and a 0.2% yield stress of $7.25 \times 10^7$ N/m²; and the sputtering surface had a (111) orientation ratio of 47.2%.

Example 2

In Example 2, a molten and cast Cu—Mn alloy (Mn: 1 wt %) ingot was forged and rolled into a rolled sheet, and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 95 and a 0.2% yield stress of $7.13 \times 10^7$ N/m²; and the sputtering surface had a (111) orientation ratio of 48.0%.

Example 3

In Example 3, a molten and cast Cu—Mn alloy (Mn: 1 wt %) ingot was forged and rolled into a rolled sheet, and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 91 and a 0.2% yield stress of $6.98 \times 10^7$ N/m²; and the sputtering surface had a (111) orientation ratio of 48.9%.

Example 4

In Example 4, a molten and cast Cu—Mn alloy (Mn: 1 wt %) ingot was forged and rolled into a rolled sheet, and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 850 mm and a thickness of 25 mm. The physical properties of the target were evaluated: The flange part had a Vicker's hardness (Hv) of 97 and a 0.2% yield stress of $7.24 \times 10^7$ N/m$^2$; and the sputtering surface had a (111) orientation ratio of 47.1%.

Example 5

In Example 5, a molten and cast Cu—Mn alloy (Mn: 0.5 wt %) ingot was forged and rolled into a rolled sheet and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 96 and a 0.2% yield stress of $7.31 \times 10^7$ N/m$^2$; and the sputtering surface had a (111) orientation ratio of 48.2%.

Example 6

In Example 6, a molten and cast Cu—Mn alloy (Mn: 10 wt %) ingot was forged and rolled into a rolled sheet and the periphery (i.e., the flange part) of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 96 and a 0.2% yield stress of $7.21 \times 10^7$ N/m$^2$; and the sputtering surface had a (111) orientation ratio of 47.9%.

Example 7

In Example 7, a molten and cast Cu—Mn alloy (Mn: 15 wt %) ingot was forged and rolled into a rolled sheet, and the periphery, i.e., the flange part of the rolled sheet was further forged. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 95 and a 0.2% yield stress of $7.19 \times 10^7$ N/m$^2$; and the sputtering surface had a (111) orientation ratio of 48.3%.

Comparative Example 1

In Comparative Example 1, a molten and cast Cu—Mn alloy (Mn: 1 wt %) ingot was forged and rolled into a rolled sheet. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 63 and a 0.2% yield stress of $4.72 \times 10^7$ N/m$^2$; and the sputtering surface had a (111) orientation ratio of 55.3%.

Comparative Example 2

In Comparative Example 2, a molten and cast Cu—Mn alloy (Mn: 1 wt %) ingot was forged and rolled into a rolled sheet. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 51 and a 0.2% yield stress of $3.92 \times 10^7$ N/m$^2$; and the sputtering surface had a (111) orientation ratio of 53.2%.

Comparative Example 3

In Comparative Example 3, a molten and cast Cu—Mn alloy (Mn: 1 wt %) ingot was forged and rolled into a rolled sheet. Subsequently, the rolled sheet was heat-treated and then rapidly cooled to obtain a target material. Then the target material was machined to form a backing plate integrated sputtering target having a diameter of 540 mm and a thickness of 25 mm. The physical properties of the target were evaluated: The flange part had a Vicker's hardness (Hv) of 48 and a 0.2% yield stress of $3.58 \times 10^7$ N/m$^2$; and the sputtering surface had a (111) orientation ratio of 54.1%.

Comparative Example 4

In Comparative Example 4, a molten and cast Cu—Mn alloy (Mn: 1 wt %) ingot was forged and rolled into a rolled sheet. Subsequently, the rolled sheet was heat-treated and then rapidly cooled to obtain a target material. Then the target material was machined to form a backing plate integrated sputtering target having a diameter of 850 mm and a thickness of 25 mm. The physical properties of the target were evaluated: The flange part had a Vicker's hardness (Hv) of 62 and a 0.2% yield stress of $4.70 \times 10^7$ N/m$^2$; and the sputtering surface had a (111) orientation ratio of 55.5%.

The targets of Examples 1 to 3 and 5 to 7 and Comparative Examples 1 to 3 were each mounted on a sputtering apparatus, and sputtering was performed at an applied power of 40 kW and an Ar gas pressure of 55 Pa. The degree of warpage of each target after the sputtering was measured (Table 1). As shown in Table 1, the degrees of warpage of the targets of Examples 1 to 3 and 5 to 7 were 0.02 to 0.05 mm. Thus, targets showing less deformation, compared to the degrees of warpage of 0.8 to 1.3 mm in the targets of Comparative Examples 1 to 3, were obtained.

The sheet resistance of each of the resulting thin films was measured, and the uniformity in the thickness of the film was calculated (Table 1). As shown in Table 1, the thin films formed using the targets of Examples 1 to 3 and 5 to 7 had thickness uniformities of 2.3% to 2.8%. Thus, the thickness uniformities were satisfactory, compared to the thickness uniformities of 5.6% to 6.3% when the targets of Comparative Examples 1 to 3 were used.

The targets of Example 4 and Comparative Example 4 had large target diameters and thereby could not be mounted on a sputtering apparatus. Consequently, these targets could not be evaluated for degree of warpage and thickness uniformity after sputtering. However, the Vicker's hardness, the 0.2% yield stress, and the (111) orientation ratio of the sputtering surfaces of the target of Example 4 were similar levels to those of other Examples, and the same thing applies to the target of Comparative Example 4. Accordingly, it is inferred that the similar effects of such as the degree of warpage of a target and thickness uniformity after sputtering can be achieved.

The results in Examples 5 to 7 demonstrate that even if the Mn content is varied within a range of 0.05 to 20 wt %, the target is provided with satisfactory physical properties by achieving a degree of warpage of the target and thickness uniformity after sputtering.

TABLE 1

|  | Hardness Hv of flange part | 0.2% yield stress (N/m²) | (111) Orientation ratio (%) at sputtering surface | Degree of warpage (mm) | Uniformity (%) (life average) |
| --- | --- | --- | --- | --- | --- |
| Example 1 | 98 | $7.25 \times 10^7$ | 47.2 | 0.02 | 2.3 |
| Example 2 | 95 | $7.13 \times 10^7$ | 48.0 | 0.03 | 2.4 |
| Example 3 | 91 | $6.98 \times 10^7$ | 48.9 | 0.05 | 2.8 |
| Example 4 | 97 | $7.24 \times 10^7$ | 47.1 | — | — |
| Example 5 | 96 | $7.31 \times 10^7$ | 48.2 | 0.05 | 2.7 |
| Example 6 | 96 | $7.21 \times 10^7$ | 47.9 | 0.03 | 2.3 |
| Example 7 | 95 | $7.19 \times 10^7$ | 48.3 | 0.02 | 2.7 |
| Comparative Example 1 | 63 | $4.72 \times 10^7$ | 55.3 | 0.8 | 5.6 |
| Comparative Example 2 | 51 | $3.92 \times 10^7$ | 53.2 | 1.1 | 5.9 |
| Comparative Example 3 | 48 | $3.58 \times 10^7$ | 54.1 | 1.3 | 6.3 |
| Comparative Example 4 | 62 | $4.70 \times 10^7$ | 55.5 | — | — |

The present invention provides a backing plate integrated sputtering target, wherein the mechanical strength of only the flange part of the target is enhanced. As a result, deformation of the target during sputtering is inhibited, and none the less, the original sputtering characteristics are not changed. Consequently, the target can form a thin film having excellent uniformity and therefore has an excellent effect of improving the yield and the reliability of semiconductor products, which have been progressing in miniaturization and integration.

In particular, the backing plate integrated sputtering target of the present invention has a self-diffusion suppression function useful for forming semiconductor copper-manganese-alloy line that can effectively prevent the periphery of the line from being contaminated by diffusion of active Cu and has excellent, for example, electron migration (EM) resistance and corrosion resistance.

The invention claimed is:

1. A backing plate integrated sputtering target comprising a Cu—Mn alloy backing plate integrated sputtering target having a composition consisting of 0.05 to 20 wt. % of Mn and the remainder being Cu, wherein the backing plate integrated sputtering target is composed of a target part having a face to be sputtered and a flange part surrounding and holding the target part, the flange part having a mechanical strength higher than that of the target part and having a Vickers hardness (Hv) of 90 or more and 0.2% yield stress of $6.98 \times 10^7$ N/m² or more, and the face of the target part having a (111) orientation ratio within a range of 47.1% to 48.9%.

2. A method of producing a backing plate integrated sputtering target composed of a target part having a face to be sputtered and a flange part surrounding and holding the target part, comprising the steps of:
   performing plastic working of a Cu—Mn alloy target material having a composition consisting of 0.05 to 20 wt. % of Mn and remainder being Cu;
   then further performing plastic working of only the flange part so that the flange part has a mechanical strength higher than that of the target part, a Vickers hardness (Hv) of 90 or more, and 0.2% yield stress of $6.98 \times 10^7$ N/m² or more; and
   after said plastic working steps, heat-treating and rapid cooling the target material;
   wherein the face to be sputtered has a (111) orientation ratio within a range of 47.1% to 48.9%.

3. A backing plate integrated sputtering target according to claim 1, wherein the Vickers hardness (Hv) of the flange part is within a range of 91 to 98.

4. A backing plate integrated sputtering target according to claim 1, wherein the 0.2% yield stress of the flange part is within a range of $6.98 \times 10^7$ to $7.31 \times 10^7$ N/m².

* * * * *